(12) United States Patent
Li

(10) Patent No.: US 11,127,642 B2
(45) Date of Patent: Sep. 21, 2021

(54) TEST CIRCUIT LAYOUT STRUCTURE FOR DISPLAY PANEL

(71) Applicant: Wuhan China Star Optoelectronics Semiconductor Display Technology Co., Ltd., Wuhan (CN)

(72) Inventor: Xue Li, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 380 days.

(21) Appl. No.: 16/349,984

(22) PCT Filed: Nov. 20, 2018

(86) PCT No.: PCT/CN2018/116406
§ 371 (c)(1),
(2) Date: May 15, 2019

(87) PCT Pub. No.: WO2020/077731
PCT Pub. Date: Apr. 23, 2020

(65) Prior Publication Data
US 2020/0168515 A1    May 28, 2020

(30) Foreign Application Priority Data

Oct. 18, 2018   (CN) .......................... 201811212954.3

(51) Int. Cl.
| H01L 21/66 | (2006.01) |
| H01L 23/60 | (2006.01) |
| H01L 27/32 | (2006.01) |
| G01R 31/317 | (2006.01) |
| G01R 31/28 | (2006.01) |

(52) U.S. Cl.
CPC .......... *H01L 22/32* (2013.01); *G01R 31/2884* (2013.01); *G01R 31/31713* (2013.01); *H01L 23/60* (2013.01); *H01L 27/3244* (2013.01)

(58) Field of Classification Search
None
See application file for complete search history.

(56) References Cited

U.S. PATENT DOCUMENTS

| 10,707,288 | B2 * | 7/2020 | Li | .......................... H01L 27/124 |
| 10,818,693 | B2 * | 10/2020 | Li | .......................... G09F 9/301 |
| 2014/0138741 | A1 * | 5/2014 | Wang | .............. H01L 21/823481 |
| | | | | 257/190 |

(Continued)

*Primary Examiner* — Jermele M Hollington

(57) ABSTRACT

A test circuit layout structure for a display panel is disclosed and includes a chip on film (COF) bonding region having two ends connected to two power conductor regions extending toward an active area; a test circuit region located between the COF bonding region and the two power conductor regions; two test pad regions and two electrostatic protection regions are both distributed around two sides of the COF bonding region; wherein a plurality of wires extend from the test pad regions and are configured to couple the electrostatic protection regions, the COF bonding region, and the test circuit region; wherein resistivity of the wires and resistivity of the power conductor regions are the same; and wherein the wires bypass the power conductor regions disposed in the same layer as the wires, alternatively, the wires and the power conductor regions are overlapped in an insulation manner.

18 Claims, 5 Drawing Sheets

(56) References Cited

U.S. PATENT DOCUMENTS

| | | | |
|---|---|---|---|
| 2019/0280074 A1* | 9/2019 | Li | H01L 27/124 |
| 2019/0391454 A1* | 12/2019 | Koide | H01L 27/124 |
| 2020/0119050 A1* | 4/2020 | Li | H01L 27/124 |
| 2021/0074622 A1* | 3/2021 | Koo | H01L 24/32 |

* cited by examiner

TEST CIRCUIT LAYOUT STRUCTURE FOR DISPLAY PANEL

RELATED APPLICATIONS

This application is a National Phase of PCT Patent Application No. PCT/CN2018/116406 having International filing date of Nov. 20, 2018, which claims the benefit of priority of Chinese Patent Application No. 201811212954.3 filed on Oct. 18, 2018. The contents of the above applications are all incorporated by reference as if fully set forth herein in their entirety.

FIELD AND BACKGROUND OF THE INVENTION

The present disclosure relates to the technical field of test circuit layout structures for displays, and specifically to a test circuit layout structure for a display panel.

With development of technology, requirements for flat panel displays are increasingly higher. For example, each of organic light emitting diode (OLED) displays has many advantages, such as a narrow frame, being light in weight, being curable, and easy to carry. The OLED displays attract widespread attention and become a mainstream.

In a manufacturing process of a general OLED display device, there are generally four phases: array ("referred as Array"), electroluminescence ("referred as EL"), thin-film encapsulation ("referred as TFE"), and module ("referred as Module"). In the manufacturing process, performance of a product testing of each phase is particularly important, because it will determine characteristics of the product, such as yield and reliability.

In a conventional flexible OLED structure, circuit design for array tester and cell test processes already exist, in order to check whether the performance of the product meets the specification requirements and to determine whether to continue producing the product for reducing resource loss, after the end of the Array and EL phases. The cell test carried out after the end of the EL phase also lays a foundation for how the subsequent products supply signals for driving. Thus, results of the cell test process are particularly important.

However, according to existing conventional designs, for panels belonging to a chip on film (COF) type, there are some color mixing problems when performing the cell test process. Therefore, the prior art has drawbacks and is needed to be urgently improved.

SUMMARY OF THE INVENTION

Some test circuit layout structures for a display panel are provided in the present disclosure, which solve a color mixing problem when performing a cell test process in the prior art.

In order to solve the above problem, an aspect of the present disclosure provides a test circuit layout structure of a display panel, wherein the display panel has a panel outline, and a border layout region is defined around an active area within the panel outline and is configured to dispose the test circuit layout structure, and the test circuit layout structure includes: a chip on film (COF) bonding region, two power conductor regions, a test circuit region, two test pad regions, and two electrostatic protection regions; wherein two ends of the COF bonding region connect the two power conductor regions extending toward the active area, the test circuit region is located between the COF bonding region and the two power conductor regions, and the two test pad regions and the two electrostatic protection regions are both distributed around two sides of the COF bonding region; wherein a plurality of wires extend from the test pad regions and are configured to couple the electrostatic protection regions, the COF bonding region, and the test circuit region; wherein resistivity of the wires and resistivity of the power conductor regions are the same; wherein the wires bypass the power conductor regions disposed in the same layer as the wires, alternatively, the wires and the power conductor regions are overlapped in an insulation manner; wherein a central axis is located between the two test pad regions and extends through the COF bonding region and the test circuit region, and the wires are symmetrically distributed around two sides of the central axis; and wherein the wires are formed of a plurality of different metal layers and are coupled via a plurality of connectors, each of the connectors connects at least two of the metal layers and passes through one between the at least two of the metal layers.

In an embodiment of the present disclosure, each of the test pad regions at one of the sides of the COF bonding region is located between one of the electrostatic protection regions and one of the power conductor regions.

In an embodiment of the present disclosure, the COF bonding region, the test circuit region, the test pad regions, and the electrostatic protection regions are coupled via the metal layers that are stacked and insulated each other; wherein the metal layers include a first metal layer, a second layer, and a third metal layer; wherein resistivity of the third layer is less than resistivity of the first metal layer and the second metal layer; wherein a plurality of first segments are formed of the first metal layer and extend from two sides of the test circuit region toward the two power conductor regions; wherein a plurality of second segments are formed of the second metal layer and extend from the two sides of the test circuit region toward the two power conductor regions, wherein a layout within the COF bonding region and the power conductor regions are both formed of the third metal layer; and wherein a plurality of third segments are formed of the third metal layer, each of the third segments is sequentially formed to extend from the test pad regions, then to traverse a layout within one of the electrostatic protection regions, then to bend away from the two power conductor regions, then to bend for traversing the layout within the COF bonding region, then to extend to a position between the test circuit region and one of the two power conductor regions, and to couple one of the first segments and the second segments.

In an embodiment of the present disclosure, the two electrostatic protection regions are located within a gap between a borderline of the COF bonding region away from the test circuit region and a borderline of the border layout region away from the test circuit region.

In an embodiment of the present disclosure, the two electrostatic protection regions are located within a gap between a borderline of the COF bonding region away from the test circuit region and a borderline of the border layout region away from the test circuit region.

In an embodiment of the present disclosure, each of the electrostatic protection regions at one of the sides of the COF bonding region is located between one of the test pad regions and one of the power conductor regions.

In an embodiment of the present disclosure, the COF bonding region, the test circuit region, the test pad regions, and the electrostatic protection regions are coupled via the metal layers that are stacked and insulated each other, wherein the metal layers comprises a first metal layer, a second layer, and a third metal layer, wherein each of the first metal layer, the second metal layer, and the third metal layer has the same resistivity, wherein a plurality of fourth segments are formed of the first metal layer or the second metal layer, each of the fourth segments is sequentially formed to traverse one of the two power conductor regions from one of two sides of the test circuit region, then to bend for traversing one of the two electrostatic protection regions, and to extend to one of the two test pad regions; wherein a layout within the COF bonding region and the power conductor regions are formed of the third metal layer; and wherein a plurality of fifth segments are formed of the third metal layer, each of the fifth segments is sequentially formed to extend from the COF bonding region toward the test circuit region, then to extend to a position between the test circuit region and one of the two power conductor regions, and to couple one of the fourth segments.

In an embodiment of the present disclosure, the COF bonding region, the test circuit region, the test pad regions, and the electrostatic protection regions are coupled via the metal layers that are stacked and insulated each other; wherein the metal layers comprises a first metal layer, a second layer, a third metal layer, and a fourth metal layer; wherein resistivity of the first metal layer and the second metal layer are both greater than resistivity of the third layer equal to resistivity of the fourth layer; wherein a plurality of sixth segments are formed of the fourth metal layer, each of the sixth segments is sequentially formed to traverse the two power conductor regions from one of two sides of the test circuit region, then to bend for traversing the two electrostatic protection regions, and to extend to one of the two test pad regions; wherein a layout within the COF bonding region and the power conductor regions are formed of the third metal layer; and wherein a plurality of seventh segments are formed of the third metal layer, each of the seventh segments is sequentially formed to extend from the COF bonding region toward the test circuit region, then to extend to a position between the test circuit region and one of the two power conductor regions, and to couple one of the sixth segments.

In order to the above problem, another aspect of the present disclosure provides a test circuit layout structure of a display panel, wherein the display panel has a panel outline, and a border layout region is defined around an active area within the panel outline and is configured to dispose the test circuit layout structure, and the test circuit layout structure includes: a chip on film (COF) bonding region, two power conductor regions, a test circuit region, two test pad regions, and two electrostatic protection regions; wherein two ends of the COF bonding region connect the two power conductor regions extending toward the active area, the test circuit region is located between the COF bonding region and the two power conductor regions, and the two test pad regions and the two electrostatic protection regions are both distributed around two sides of the COF bonding region; wherein a plurality of wires extend from the test pad regions and are configured to couple the electrostatic protection regions, the COF bonding region, and the test circuit region; wherein resistivity of the wires and resistivity of the power conductor regions are the same; and wherein the wires bypass the power conductor regions disposed in the same layer as the wires, alternatively, the wires and the power conductor regions are overlapped in an insulation manner.

In an embodiment of the present disclosure, each of the test pad regions at one of the sides of the COF bonding region is located between one of the electrostatic protection regions and one of the power conductor regions.

In an embodiment of the present disclosure, the COF bonding region, the test circuit region, the test pad regions, and the electrostatic protection regions are coupled via the metal layers that are stacked and insulated each other; wherein the metal layers include a first metal layer, a second layer, and a third metal layer; wherein resistivity of the third layer is less than resistivity of the first metal layer and the second metal layer; wherein a plurality of first segments are formed of the first metal layer and extend from two sides of the test circuit region toward the two power conductor regions; wherein a plurality of second segments are formed of the second metal layer and extend from the two sides of the test circuit region toward the two power conductor regions, wherein a layout within the COF bonding region and the power conductor regions are both formed of the third metal layer; and wherein a plurality of third segments are formed of the third metal layer, each of the third segments is sequentially formed to extend from the test pad regions, then to traverse a layout within one of the electrostatic protection regions, then to bend away from the two power conductor regions, then to bend for traversing the layout within the COF bonding region, then to extend to a position between the test circuit region and one of the two power conductor regions, and to couple one of the first segments and the second segments.

In an embodiment of the present disclosure, the two electrostatic protection regions are located within a gap between a borderline of the COF bonding region away from the test circuit region and a borderline of the border layout region away from the test circuit region.

In an embodiment of the present disclosure, the third segments within the gap bend away from one of the two power conductor regions to bend for traversing a layout within the COF bonding region.

In an embodiment of the present disclosure, each of the electrostatic protection regions at one of the sides of the COF bonding region is located between one of the test pad regions and one of the power conductor regions.

In an embodiment of the present disclosure, the COF bonding region, the test circuit region, the test pad regions, and the electrostatic protection regions are coupled via the metal layers that are stacked and insulated each other, wherein the metal layers includes a first metal layer, a second layer, and a third metal layer, wherein each of the first metal layer, the second metal layer, and the third metal layer has the same resistivity, wherein a plurality of fourth segments are formed of the first metal layer or the second metal layer, each of the fourth segments is sequentially formed to traverse one of the two power conductor regions from one of two sides of the test circuit region, then to bend for traversing one of the two electrostatic protection regions, and to extend to one of the two test pad regions; wherein a layout within the COF bonding region and the power conductor regions are formed of the third metal layer; and wherein a plurality of fifth segments are formed of the third metal layer, each of the fifth segments is sequentially formed to extend from the COF bonding region toward the test circuit region, then to extend to a position between the test circuit region and one of the two power conductor regions, and to couple one of the fourth segments.

In an embodiment of the present disclosure, the COF bonding region, the test circuit region, the test pad regions, and the electrostatic protection regions are coupled via the metal layers that are stacked and insulated each other; wherein the metal layers comprises a first metal layer, a second layer, a third metal layer, and a fourth metal layer; wherein resistivity of the first metal layer and the second metal layer are both greater than resistivity of the third layer equal to resistivity of the fourth layer; wherein a plurality of sixth segments are formed of the fourth metal layer, each of the sixth segments is sequentially formed to traverse the two power conductor regions from one of two sides of the test circuit region, then to bend for traversing the two electrostatic protection regions, and to extend to one of the two test pad regions; wherein a layout within the COF bonding region and the power conductor regions are formed of the third metal layer; and wherein a plurality of seventh segments are formed of the third metal layer, each of the seventh segments is sequentially formed to extend from the COF bonding region toward the test circuit region, then to extend to a position between the test circuit region and one of the two power conductor regions, and to couple one of the sixth segments.

In an embodiment of the present disclosure, a central axis is located between the two test pad regions and extends through the COF bonding region and the test circuit region, and the wires are symmetrically distributed around two sides of the central axis.

In an embodiment of the present disclosure, the wires are formed of a plurality of different metal layers and are coupled via a plurality of connectors, each of the connectors connects at least two of the metal layers and passes through one between the at least two of the metal layers.

Compared with the prior art, the test circuit layout structure for the display panel of the present disclosure can avoid color mixing due to signal delay. Because signals outputted from the test pad regions are transmitted by the wires with small resistivity, and the wires bypasses the power conductor regions disposed in the same layer as the wires, alternatively, the wires and the power conductor regions are overlapped in an insulation manner. There is no short-circuit problem, and no obvious signal delay occurs, thus avoiding occurrence of color mixing due to signal delay. If the COF bonding region and a chip on film (COF) are bonded, a drive testing can be similar to a normal operation as a reference for subsequent signal adjustments.

DESCRIPTION OF SPECIFIC EMBODIMENTS OF THE INVENTION

Following description of the various embodiments is provided to illustrate the specific embodiments of the present disclosure. Furthermore, directional terms mentioned in the present disclosure, such as upper, lower, then top, bottom, front, rear, left, right, inner, outer, side, surrounding, central, horizontal, lateral, vertical, longitudinal, axial, radial, uppermost layer or lowermost layer, only refer to direction of additional drawings. Therefore, the directional terms are only used for illustrating and understanding of the present disclosure, and are not intended to limit the present disclosure.

Figure 1:
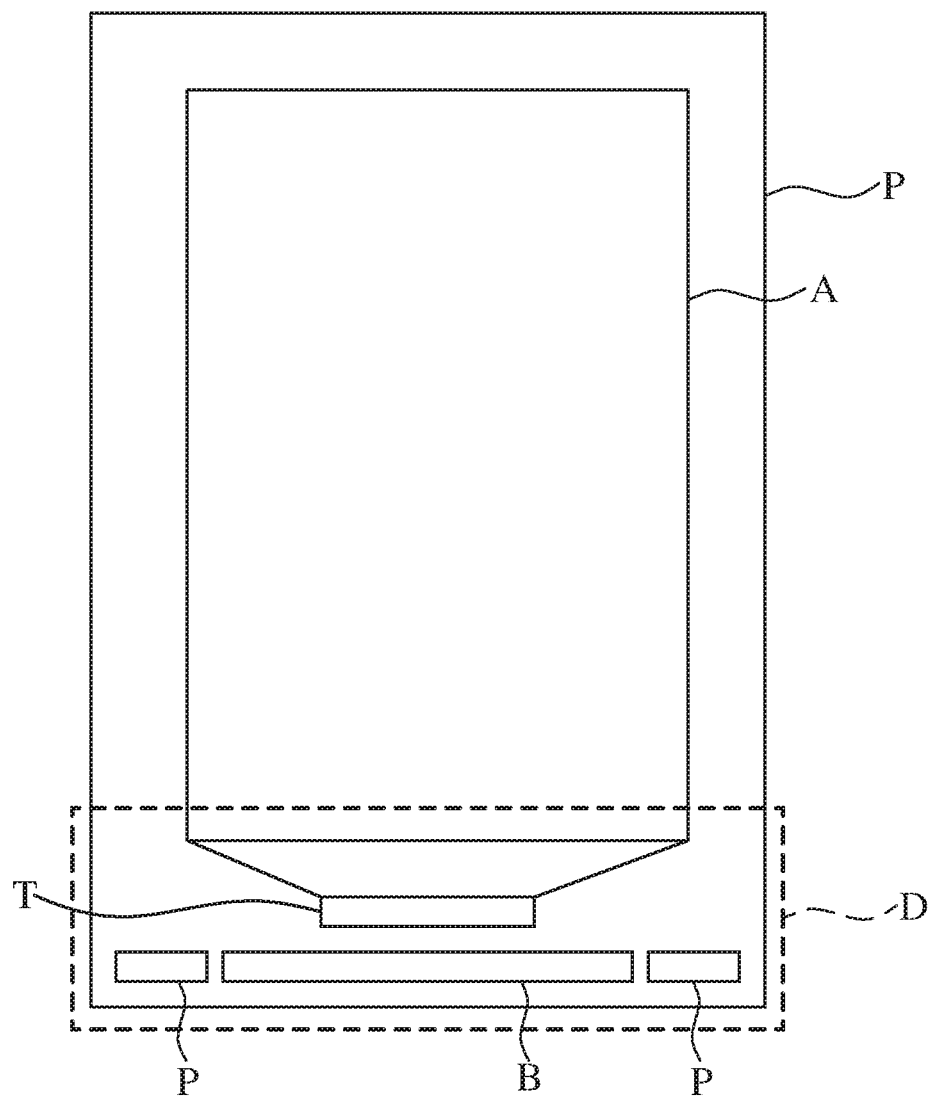
FIG. 1 is a schematic diagram illustrating an outline of a chip on film (COF) type panel.

Please refer to FIG. 1, a test circuit layout structure for a display panel according to the present disclosure may be adopted to a panel used for a display, such as a chip on film (COF) type panel. The display panel has a panel outline P, wherein an active area A and a border layout region D around the active area are defined within the panel outline P. The active area A may be capable of a display function, such as upper, lower, left, and right border regions around the active area A within the panel outline P. Specifically, the lower border region may be defined as the border layout region D that is configured to dispose the test circuit layout structure, which may include a COF bonding region B, a test circuit region T, and two test pad regions P. The COF bonding region B may be configured for bonding a chip on film in a panel. The test circuit region T may be configured to dispose a panel testing circuit, which is configured to test electric characteristics of the active area A. The test pad regions P may be used to input signals for testing.

Please refer to FIG. 1 again, in the test circuit layout structure for the display panel, in addition to the COF bonding region B, the test circuit region T, and the two test pad regions P, the test circuit layout structure of the display panel may include two power conductor regions V and two electrostatic protection regions E. Two ends of the COF bonding region B connect the two power conductor regions V, which extend toward the active area A. The test circuit region T is located between the COF bonding region B and the two power conductor regions V. The two test pad regions P and the two electrostatic protection regions E are both distributed around two sides of the COF bonding region.

In addition, a plurality of wires extend from the test pad regions P and are configured to couple the electrostatic protection regions E, the COF bonding region B, and the test circuit region T, wherein resistivity of the wires and resistivity of the power conductor regions are the same. Further, the wires bypass the power conductor regions V disposed in the same layer as the wires, alternatively, the wires and the power conductor regions V are overlapped in an insulation manner.

Hereinafter, different embodiments of the test circuit layout structure of the display panel of the present disclosure will be described by way of example.

Figure 2:
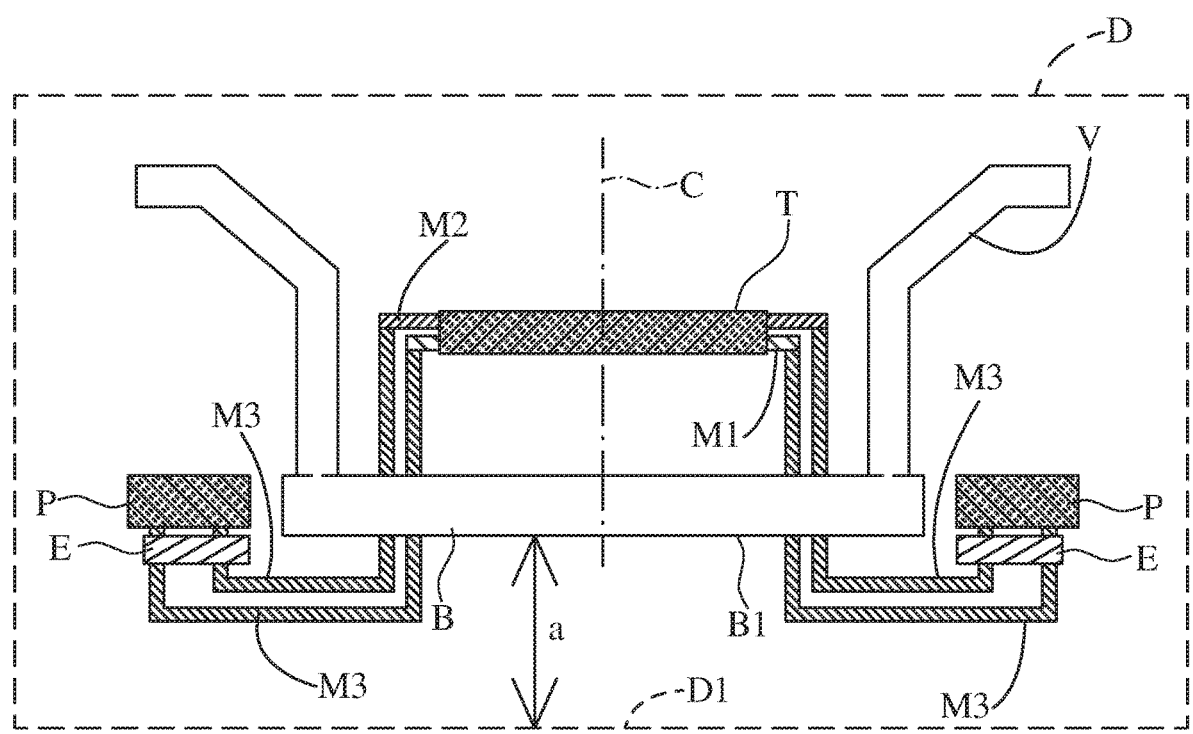
FIG. 2 is a schematic diagram illustrating a test circuit layout structure of a display panel, according to a first embodiment of the present disclosure.

In a first embodiment, as shown in FIGS. 1 and 2, each of the test pad regions P at one of the sides of the COF bonding region B is located between one of the electrostatic protection regions E and one of the power conductor regions V. Specifically, as shown in FIG. 2, the two electrostatic protection regions E are located within a gap a between a borderline B1 of the COF bonding region B away from the test circuit region T and a borderline D1 of the border layout region D away from the test circuit region T.

Please refer to FIG. 2 again, the COF bonding region B, the test circuit region T, the test pad regions P, and the electrostatic protection regions E are coupled via a plurality of metal layers that are stacked and insulated each other. By way of example, at least two of the metal layers are connected and passed via a plurality of connectors that are made of an electrical conductor, such as a metal or an alloy.

Figure 3:
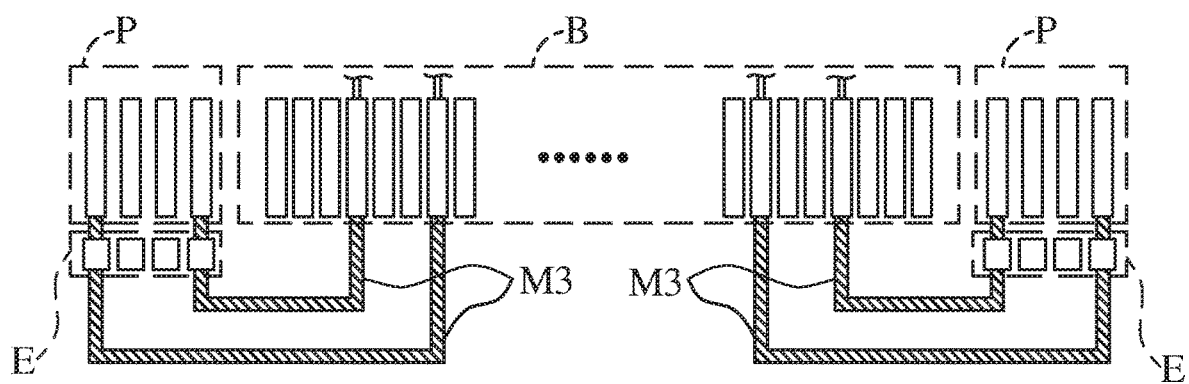
FIG. 3 is a schematic diagram illustrating layouts within a COF bonding region, a test circuit region, and two electrostatic protection regions, according to the present disclosure.

By way of example, the metal layers may include a first metal layer, a second layer, and a third metal layer, wherein a plurality of first segments M1 are formed of the first metal layer and extend from two sides of the test circuit region T toward the two power conductor regions V, a plurality of second segments M2 are formed of the second metal layer and extend from the two sides of the test circuit region T toward the two power conductor regions V. In addition, a layout within the COF bonding region B (as shown in FIG. 3) and the power conductor regions V are both formed of the third metal layer, wherein a plurality of third segments M3 are formed of the third metal layer, each of the third segments M3 is sequentially formed to extend from the test pad regions P, then to traverse a layout within one of the electrostatic protection regions E (as shown in FIG. 3, the third segments M3 may connect to at least one of a plurality of conducting lines within the above layout), then to bend away from the two power conductor regions V, then to bend for traversing the layout within the COF bonding region B, for example, the third segments M3 may bend in the gap a to extend away from the two power conductor regions, then to bend for traversing the layout within the COF bonding region B. To continue, each of the third segments M3 is further formed to extend to a position between the test circuit region T and one of the two power conductor regions V, and then, each of the third segments M3 is formed to couple one of the first segments M1 and the second segments M2.

Specifically, the first segments M1, the second segments M2, and the third segments M3 may be coupled via the plurality of connectors (not shown in figures).

In an embodiment, resistivity of the third layer is less than resistivity of the first metal layer and the second metal layer. For example, the resistivity of the first metal layer and the second metal layer is ten times of the resistivity of the third metal layer, for example, a material of the first metal layer and the second metal layer may be molybdenum (Mo). In addition, material of the third metal layer may be titanium (Ti)/aluminum (Al)/titanium (Ti).

In an embodiment, as shown in FIG. 2, a central axis C is located between the two test pad regions P and extends through the COF bonding region B and the test circuit region T. The first segments M1, the second segments M2, and the third segments M3 may be symmetrically distributed around two sides of the central axis C.

Thus, a part of the wires belonging to the third segments formed of the third metal layer bypasses the two power conductor regions formed of the third metal layer. There is no short circuit problem. In addition, because signals outputted from the test pad regions are transmitted by the wires formed of the third metal layer with small resistivity, there is no obvious signal delay, thereby avoiding color mixing due to signal delay. If the COF bonding region and a chip on film (COF) are bonded, a drive testing can be similar to a normal operation as a reference for subsequent signal adjustments.

Figure 4:
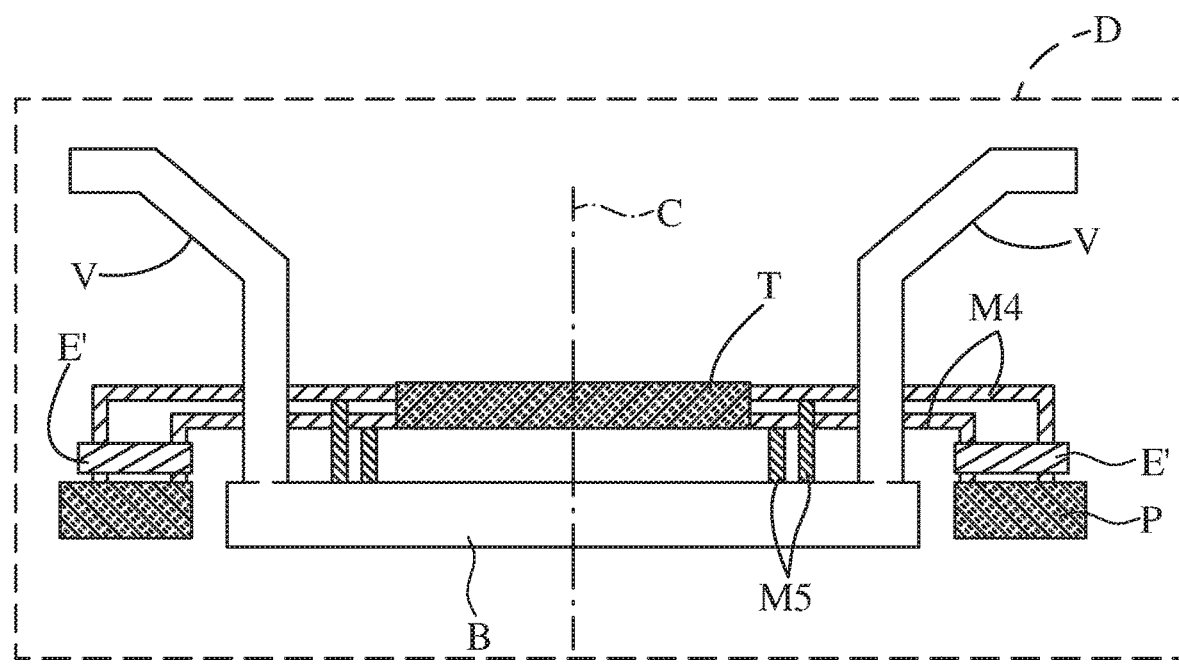
FIG. 4 is a schematic diagram illustrating a test circuit layout structure of a display panel, according to a second embodiment of the present disclosure.

In a second embodiment, as shown in FIG. 4, the two electrostatic protection regions are changed to be marked as E'. Positions of the two electrostatic protection regions E' are different from positions of the two electrostatic protection regions E in the first embodiment, wherein each of the electrostatic protection regions E' at one of the sides of the COF bonding region B is located between one of the test pad regions P and one of the power conductor regions V. Please refer to FIG. 4 again, the COF bonding region B, the test circuit region T, the test pad regions P, and the electrostatic protection regions E' are coupled via a plurality of metal layers that are stacked and insulated each other.

By way of example, the metal layers may include a first metal layer, a second layer, and a third metal layer, wherein each of the first metal layer, the second metal layer, and the third metal layer has the same resistivity. Specifically, material of the first metal layer, the second metal layer, and the third metal layer are the same as a material with small resistivity, such as titanium (Ti)/aluminum (Al)/titanium (Ti). In addition, a plurality of fourth segments M4 are formed of the first metal layer or the second metal layer, each of the fourth segments M4 is sequentially formed to traverse one of the two power conductor regions V from one of two sides of the test circuit region T, then to bend for traversing one of the two electrostatic protection regions E', and to extend to one of the two test pad regions P. In addition, a layout within the COF bonding region B (as shown in FIG. 3) and the power conductor regions V are formed of the third metal layer. In addition, a plurality of fifth segments M5 are formed of the third metal layer, each of the fifth segments M5 is sequentially formed to extend from the COF bonding region B toward the test circuit region T, then to extend to a position between the test circuit region T and the two power conductor regions V, and to couple one of the fourth segments M4.

Specifically, the fourth segments M4 and the fifth segments M5 may be coupled via the plurality of connectors (not shown in figures).

In an embodiment, as shown in FIG. 4, a central axis C is located between the two test pad regions P and extends through the COF bonding region B and the test circuit region T, wherein the fourth segments M4 and the fifth segments M5 may be symmetrically distributed around two sides of the central axis C.

Thus, a part of the wires belonging to the fourth segments formed of the first or second metal layers is insulated from the two power conductor regions formed of the third metal layer. There is no short circuit problem. In addition, because signals outputted from the test pad regions are transmitted by the wires formed of the first or second metal layers with small resistivity, there is no obvious signal delay, thereby avoiding color mixing due to signal delay. If the COF bonding region and a chip on film (COF) are bonded, a drive testing can be similar to a normal operation as a reference for subsequent signal adjustments.

Figure 5:
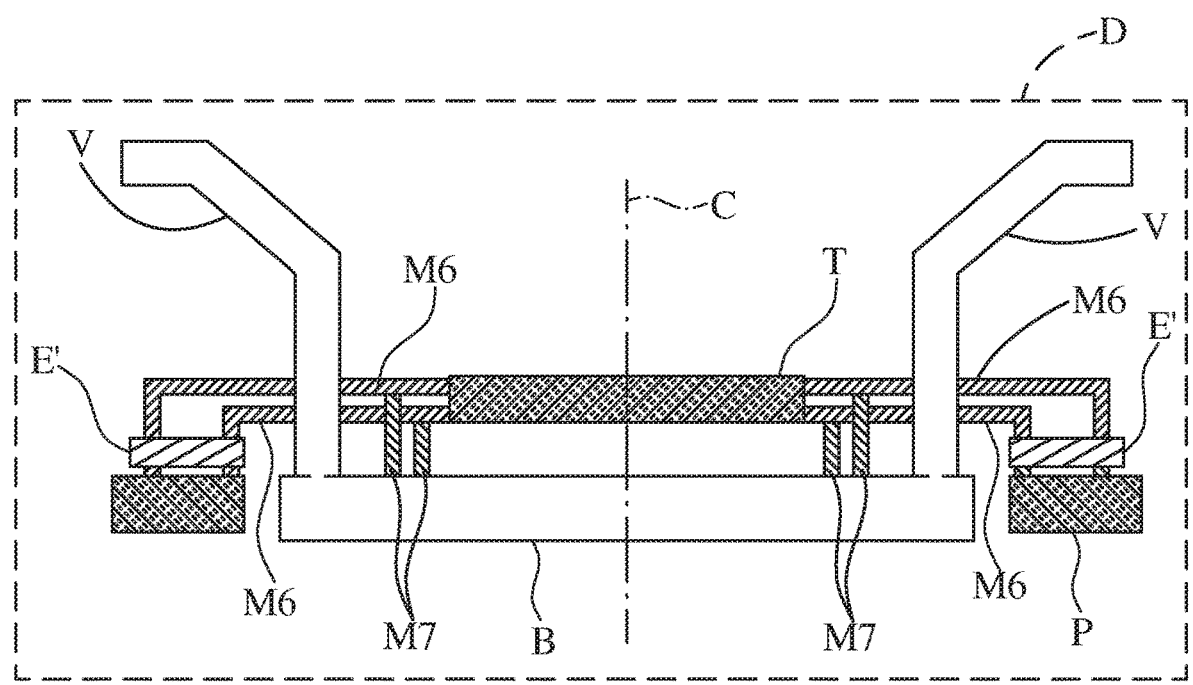
FIG. 5 is a schematic diagram illustrating a test circuit layout structure of a display panel, according to a third embodiment of the present disclosure.

In a third embodiment, as shown in FIG. 5, each of the electrostatic protection regions E' at one of the sides of the COF bonding region B is located between one of the test pad regions P and one of the power conductor regions V. Please refer to FIG. 5 again, the COF bonding region B, the test circuit region T, the test pad regions P, and the electrostatic protection regions E' are coupled via a plurality of metal layers that are stacked and insulated each other.

By way of example, the metal layers may include a first metal layer, a second layer, a third metal layer, and a fourth metal layer, wherein resistivity of the first metal layer and the second metal layer are both greater than resistivity of the third layer equal to resistivity of the fourth layer. In addition, a plurality of sixth segments M6 are formed of the fourth metal layer, each of the sixth segments M6 is sequentially formed to traverse the two power conductor regions V from two sides of the test circuit region T, then to bend for traversing the two electrostatic protection regions E', and to extend to one of the two test pad regions P. In addition, a layout within the COF bonding region B (as shown in FIG. 3) and the power conductor regions are formed of the third metal layer. In addition, a plurality of seventh segments M7 are formed of the third metal layer, each of the seventh segments M7 is sequentially formed to extend from the COF bonding region B toward the test circuit region T, then to extend to a position between the test circuit region T and the two power conductor regions V, and to couple one of the sixth segments M6.

Specifically, the sixth segments M6 and the seventh segments M7 may be coupled via the plurality of connectors (not shown in figures).

In an embodiment, as shown in FIG. 5, a central axis C is located between the two test pad regions P and extends through the COF bonding region B and the test circuit region T, wherein the sixth segments M6 and the seventh segments M7 may be symmetrically distributed around two sides of the central axis C.

Thus, the fourth metal layer can be added to the existing circuit layout, a part of the wires belonging to the sixth segments formed of the fourth metal layer is insulated from the two power conductor regions formed of the third metal layer. There is no short circuit problem. In addition, because signals outputted from the test pad regions are transmitted by the wires formed of the fourth metal layer with small resistivity, there is no obvious signal delay, thereby avoiding color mixing due to signal delay. If the COF bonding region and a chip on film (COF) are bonded, a drive testing can be similar to a normal operation as a reference for subsequent signal adjustments.

The present disclosure has been described by the above related embodiments, but the above embodiments are merely examples for implementing the present disclosure. It must be noted that, the disclosed embodiments do not limit the scope of the present disclosure. Rather, the scope of the present disclosure includes modifications and equivalent arrangements involved in spirit and scope of claims.

What is claimed is:

1. A test circuit layout structure of a display panel, wherein the display panel has a panel outline, and a border layout region is defined around an active area within the panel outline and is configured to dispose the test circuit layout structure, the test circuit layout structure comprising:
    a chip on film (COF) bonding region, two power conductor regions, a test circuit region, two test pad regions, and two electrostatic protection regions; wherein two ends of the COF bonding region connect the two power conductor regions extending toward the active area, the test circuit region is located between the COF bonding region and the two power conductor regions, and the two test pad regions and the two electrostatic protection regions are both distributed around two sides of the COF bonding region;
    wherein a plurality of wires extend from the test pad regions and are configured to couple the electrostatic protection regions, the COF bonding region, and the test circuit region; wherein resistivity of the wires and resistivity of the power conductor regions are the same; wherein the wires bypass the power conductor regions disposed in the same layer as the wires, alternatively, the wires and the power conductor regions are overlapped in an insulation manner;
    wherein a central axis is located between the two test pad regions and extends through the COF bonding region and the test circuit region, and the wires are symmetrically distributed around two sides of the central axis; and
    wherein the wires are formed of a plurality of different metal layers and are coupled via a plurality of connectors, each of the connectors connects at least two of the metal layers and passes through one between the at least two of the metal layers.

2. The test circuit layout structure for the display panel as claimed in claim 1, wherein each of the test pad regions at one of the sides of the COF bonding region is located between one of the electrostatic protection regions and one of the power conductor regions.

3. The test circuit layout structure for the display panel as claimed in claim 2, wherein the COF bonding region, the test circuit region, the test pad regions, and the electrostatic protection regions are coupled via the metal layers that are stacked and insulated each other; wherein the metal layers comprise a first metal layer, a second layer, and a third metal layer; wherein resistivity of the third layer is less than resistivity of the first metal layer and the second metal layer; wherein a plurality of first segments are formed of the first metal layer and extend from two sides of the test circuit region toward the two power conductor regions; wherein a plurality of second segments are formed of the second metal layer and extend from the two sides of the test circuit region toward the two power conductor regions, wherein a layout within the COF bonding region and the power conductor regions are both formed of the third metal layer; and wherein a plurality of third segments are formed of the third metal layer, each of the third segments sequentially extends from one of the test pad regions through one of the electrostatic protection regions and through the COF bonding region and connects to one of the first segments and the second segments in a region between the test circuit region and the power conductor regions, the third segments not crossing over the power conductor regions.

4. The test circuit layout structure for the display panel as claimed in claim 3, wherein the two electrostatic protection regions are located within a gap between a borderline of the COF bonding region away from the test circuit region and a borderline of the border layout region away from the test circuit region.

5. The test circuit layout structure for the display panel as claimed in claim 4, wherein the third segments within the gap bend away from one of the two power conductor regions to bend for traversing a layout within the COF bonding region.

6. The test circuit layout structure for the display panel as claimed in claim 1, wherein, each of the electrostatic protection regions at one of the sides of the COF bonding region is located between one of the test pad regions and one of the power conductor regions.

7. The test circuit layout structure for the display panel as claimed in claim 6, wherein the COF bonding region, the test circuit region, the test pad regions, and the electrostatic protection regions are coupled via the metal layers that are stacked and insulated each other, wherein the metal layers comprises a first metal layer, a second layer, and a third metal layer, wherein each of the first metal layer, the second metal layer, and the third metal layer has the same resistivity, wherein a plurality of fourth segments are formed of the first metal layer or the second metal layer, each of the fourth segments sequentially extends from one of two sides of the test circuit region and across one of the power conductors and connects to one of the test pad regions through one of the electrostatic protection regions wherein a layout within the COF bonding region and the power conductor regions are formed of the third metal layer; and wherein a plurality of fifth segments are formed of the third metal layer, each of the fifth segments sequentially extends from the COF bonding region toward the test circuit region to a region between the test circuit region and one of the two power conductor regions and connects to one of the fourth segments.

8. The test circuit layout structure for the display panel as claimed in claim 6, wherein the COF bonding region, the test circuit region, the test pad regions, and the electrostatic protection regions are coupled via the metal layers that are stacked and insulated each other; wherein the metal layers comprises a first metal layer, a second layer, a third metal layer, and a fourth metal layer; wherein resistivity of the first metal layer and the second metal layer are both greater than resistivity of the third layer equal to resistivity of the fourth layer; wherein a plurality of sixth segments are formed of the fourth metal layer, each of the sixth segments sequentially extends from one of two sides of the test circuit region and across one of the power conductors and connects to one of the test pad regions through one of the electrostatic protection regions; wherein a layout within the COF bonding region and the power conductor regions are formed of the third metal layer; and wherein a plurality of seventh segments are formed of the third metal layer, each of the seventh segments sequentially extends from the COF bonding region toward the test circuit region to a region between the test circuit region and one of the two power conductor regions and connects to one of the sixth segments.

9. A test circuit layout structure of a display panel, wherein the display panel has a panel outline, and a border layout region is defined around an active area within the panel outline and is configured to dispose the test circuit layout structure, the test circuit layout structure comprising:
  a chip on film (COF) bonding region, two power conductor regions, a test circuit region, two test pad regions, and two electrostatic protection regions; wherein two ends of the COF bonding region connect the two power conductor regions extending toward the active area, the test circuit region is located between the COF bonding region and the two power conductor regions, and the two test pad regions and the two electrostatic protection regions are both distributed around two sides of the COF bonding region;
  wherein a plurality of wires extend from the test pad regions and are configured to couple the electrostatic protection regions, the COF bonding region, and the test circuit region; wherein resistivity of the wires and resistivity of the power conductor regions are the same; and wherein the wires bypass the power conductor regions disposed in the same layer as the wires, alternatively, the wires and the power conductor regions are overlapped in an insulation manner.

10. The test circuit layout structure for the display panel as claimed in claim 9, wherein each of the test pad regions at one of the sides of the COF bonding region is located between one of the electrostatic protection regions and one of the power conductor regions.

11. The test circuit layout structure for the display panel as claimed in claim 10, wherein the COF bonding region, the test circuit region, the test pad regions, and the electrostatic protection regions are coupled via the metal layers that are stacked and insulated each other; wherein the metal layers comprise a first metal layer, a second layer, and a third metal layer; wherein resistivity of the third layer is less than resistivity of the first metal layer and the second metal layer; wherein a plurality of first segments are formed of the first metal layer and extend from two sides of the test circuit region toward the two power conductor regions; wherein a plurality of second segments are formed of the second metal layer and extend from the two sides of the test circuit region toward the two power conductor regions, wherein a layout within the COF bonding region and the power conductor regions are both formed of the third metal layer; and wherein a plurality of third segments are formed of the third metal layer, each of the third segments sequentially extends from one of the test pad regions through one of the electrostatic protection regions and through the COF bonding region and connects to one of the first segments and the second segments in a region between the test circuit region and the power conductor regions, the third segments not crossing over the power conductor regions.

12. The test circuit layout structure for the display panel as claimed in claim 11, wherein the two electrostatic protection regions are located within a gap between a borderline of the COF bonding region away from the test circuit region and a borderline of the border layout region away from the test circuit region.

13. The test circuit layout structure for the display panel as claimed in claim 12, wherein the third segments within the gap bend away from one of the two power conductor regions to bend for traversing a layout within the COF bonding region.

14. The test circuit layout structure for the display panel as claimed in claim 9, wherein each of the electrostatic protection regions at one of the sides of the COF bonding region is located between one of the test pad regions and one of the power conductor regions.

15. The test circuit layout structure for the display panel as claimed in claim 14, wherein the COF bonding region, the test circuit region, the test pad regions, and the electrostatic protection regions are coupled via the metal layers that are stacked and insulated each other, wherein the metal layers comprises a first metal layer, a second layer, and a third metal layer, wherein each of the first metal layer, the second metal layer, and the third metal layer has the same resistivity, wherein a plurality of fourth segments are formed of the first metal layer or the second metal layer, each of the fourth segments sequentially extends from one of two sides of the test circuit region and across one of the power conductors and connects to one of the test pad regions through one of the electrostatic protection regions; wherein a layout within the COF bonding region and the power conductor regions are formed of the third metal layer; and wherein a plurality of fifth segments are formed of the third metal layer, each of the fifth segments sequentially extends from the COF bonding region toward the test circuit region to a region between the test circuit region and one of the two power conductor regions and connects to one of the fourth segments.

16. The test circuit layout structure for the display panel as claimed in claim 14, wherein the COF bonding region, the test circuit region, the test pad regions, and the electrostatic protection regions are coupled via the metal layers that are stacked and insulated each other; wherein the metal layers comprises a first metal layer, a second layer, a third metal layer, and a fourth metal layer; wherein resistivity of the first metal layer and the second metal layer are both greater than resistivity of the third layer equal to resistivity of the fourth layer; wherein a plurality of sixth segments are formed of the fourth metal layer, each of the sixth segments sequentially extends from one of two sides of the test circuit region and across one of the power conductors and connects to one of the test pad regions through one of the electrostatic protection regions; wherein a layout within the COF bonding region and the power conductor regions are formed of the third metal layer; and wherein a plurality of seventh segments are formed of the third metal layer, each of the seventh segments sequentially extends from the COF bonding region toward the test circuit region to a region between the test circuit region and one of the two power conductor regions and connects to one of the sixth segments.

17. The test circuit layout structure for the display panel as claimed in claim 9, wherein a central axis is located between the two test pad regions and extends through the COF bonding region and the test circuit region, and the wires are symmetrically distributed around two sides of the central axis.

18. The test circuit layout structure for the display panel as claimed in claim 9, wherein the wires are formed of a plurality of different metal layers and are coupled via a plurality of connectors, each of the connectors connects at least two of the metal layers and passes through one between the at least two of the metal layers.

\* \* \* \* \*